US007498120B2

(12) United States Patent
Sadwick et al.

(10) Patent No.: US 7,498,120 B2
(45) Date of Patent: Mar. 3, 2009

(54) VACUUM COMPATIBLE HIGH FREQUENCY ELECTROMAGNETIC AND MILLIMETER WAVE SOURCE COMPONENTS, DEVICES AND METHODS OF MICRO-FABRICATING

(75) Inventors: Laurence P. Sadwick, Salt Lake City, UT (US); Jehn-Huar Chern, Salt Lake City, UT (US); Ruey-Jen Hwu, Salt Lake City, UT (US)

(73) Assignee: Innosys, Inc., Salt Lake City, UT (US)

( * ) Notice: Subject to any disclaimer, the term of this patent is extended or adjusted under 35 U.S.C. 154(b) by 765 days.

(21) Appl. No.: 10/941,689

(22) Filed: Sep. 15, 2004

(65) Prior Publication Data

US 2006/0057505 A1 Mar. 16, 2006

(51) Int. Cl.
*G03F 7/00* (2006.01)

(52) U.S. Cl. ........................ 430/315; 430/319; 430/321

(58) Field of Classification Search ....................... None
See application file for complete search history.

(56) References Cited

U.S. PATENT DOCUMENTS

| | | | | |
|---|---|---|---|---|
| 4,102,037 | A | 7/1978 | Espaignol et al. | |
| 4,197,546 | A | 4/1980 | Cachier et al. | |
| 4,278,951 | A | 7/1981 | Cachier et al. | |
| 4,280,110 | A | 7/1981 | Cachier et al. | |
| 4,553,068 | A | 11/1985 | Brandt | |
| 4,801,848 | A | 1/1989 | Birnbach et al. | |
| 5,266,155 | A | 11/1993 | Gray | |
| 5,355,380 | A | 10/1994 | Lin et al. | |
| 5,688,618 | A * | 11/1997 | Hulderman et al. | 430/22 |
| 6,363,605 | B1 * | 4/2002 | Shih et al. | 29/600 |

OTHER PUBLICATIONS

"Muri W-band klystrino beamtester results"—test report by Glenn Scheitrum, Alex Burke, George Caryotakis, Andy Haase and Liqun Song, from the Stanford Linear Accelerator Center, Menlo Park California.

M. Hess and C.Chen, "Confinement of High-Intensity Bunched Beams in High-Power Periodic Permanent Magnet Focusing Klystrons", published by IEEE in 2001 as part of the Proceedings of the 2001 Particle Accelerator Conference, Chicago, pp. 3302-3304.

English language abstract of CN 1444309 A (Sep. 2003).

English language abstract of JP 11346103 A2 (Dec. 1999).

* cited by examiner

*Primary Examiner*—John A. McPherson
(74) *Attorney, Agent, or Firm*—Morriss O'Bryant Compagni

(57) ABSTRACT

Vacuum compatible high frequency electromagnetic and millimeter wave source components, devices and methods of micro-fabricating such components and devices are disclosed. Embodiments of the methods may include using a UV-curable photoresist, such as SU-8 to form structures having height up to and exceeding 1 mm. High frequency electromagnetic wave sources including the inventive high frequency electromagnetic wave source components are also disclosed.

50 Claims, 11 Drawing Sheets

VACUUM COMPATIBLE HIGH FREQUENCY ELECTROMAGNETIC AND MILLIMETER WAVE SOURCE COMPONENTS, DEVICES AND METHODS OF MICRO-FABRICATING

BACKGROUND OF THE INVENTION

1. Field of the Invention

Embodiments of the present invention relate generally to devices for generating electromagnetic radiation. More particularly, embodiments of the present invention include vacuum compatible high frequency electromagnetic wave source components and methods of micro-fabricating devices including such vacuum compatible high frequency electromagnetic wave source components.

2. State of the Art

Conventional methods for producing microwave and millimeter wavelength electromagnetic radiation are well known in the art. Such conventional methods typically involve the use of electron tubes that rely on various forms of velocity modulation of an electron beam. Electron beam modulation may then be followed by some form of drift used to achieve electron density bunching. After bunching, the electron kinetic energy may be converted into microwave or millimeter waves. In klystrons, this may be achieved using two-cavity and multi-cavity configurations. Klystrons tend to be bandwidth limited, however. To achieve wider bandwidths, traveling wave velocity modulation is used. For example, in a conventional traveling wave tube amplifier (TWTA) electrons interact with the longitudinal electric component of a slow electromagnetic wave. The phase velocity of the electromagnetic wave is slowed down to match the electron velocity. The slow wave structure (SWS) of a traveling wave tube (TWT) provides continuous and cumulative interaction between the electron beam and the electromagnetic wave, thereby producing microwaves or millimeter waves over bandwidths of an octave or more.

Klystrons are among the oldest of the electron velocity modulated devices dating back to the 1930s. Smaller klystrons find a number of uses where relatively very narrow bandwidth is acceptable. A class of miniature klystron devices is known as "Klystrinos". Klystrinos utilize manufacturing techniques employing a photosensitive material which requires X-rays from an instrument known as synchrotron radiation source to expose the photosensitive materials. Besides the scarcity of such synchrotrons, structures fabricated by this technique require extensive additional and final machining to have the proper physical and electrical characteristics.

The surface-finish of the Klystrino output cavity is critical to the efficiency of the device. Good surface finish is required to obtain maximum quality factor, $Q_o$. Circuit efficiency $\eta_{ckt}=Q_o/(Q_o+Q_o)$, increases with increasing $Q_o$. Early RF designs of the 95 GHz Klystrino circuit determined that the optimum external $Q(Q_c)$ in the output cavity was on the order of 250. The best $Q_o$ obtainable with normal machining or EDM was around 800 at 95 GHz. Circuit efficiency in this case would be 76%, implying that 316 Watts would be absorbed in the walls of the output cavity in order to realize a 1 kW average output, power. This would severely limit the average power achievable from the Klystrino. The theoretical maximum $Q_o$ for a copper cavity is around 1550. An alternative fabrication method was required to achieve an intrinsic Q close to the theoretical maximum.

LIGA fabrication has been considered the only process capable of producing copper cavities with surface finish good enough to approach the theoretical value for Q. LIGA is a German acronym for X-ray lithography, electrodeposition and molding. One drawback with LIGA fabrication is that it requires access to a synchrotron light source. Thus, a limited number of facilities exist that could produce LIGA processed substrates for a Klystrino.

Another drawback with the conventional LIGA fabrication process is exposing the polymethylmethacrylate (PMMA) photoresist to a depth of 1 mm. In order to produce 1 mm deep structures, a 25 micron thick gold X-ray mask is bonded to the top of the PMMA and the assembly is then exposed and etched repeatedly until the 1 mm depth is reached. The repeated exposure and etching steps and use of gold for an X-ray mask add to the cost of producing electronic devices using the LIGA process.

Another constraint sometimes encountered with LIGA processing is the need to use aluminum as the substrate for the LIGA process, as opposed to other substrate materials. Aluminum is desirable for LIGA processing because it has a low atomic number and, therefore, the backscattering of X-ray photons is minimized. Aluminum also has a high coefficient of expansion that tends to match the expansion of the PMMA photoresist. Additionally, the surface of an aluminum substrate can easily be roughened to provide better adhesion for the PMMA photoresist. The combination of roughened surface and high coefficient of expansion enables the bond between the aluminum and the PMMA photoresist to survive the repeated thermal cycling that occurs with multiple exposures. Backscattering can be a problem because photons backscattered from the substrate can expose the PMMA photoresist near the edge of the mask, resulting in PMMA columns that are undercut. If the backscattering is severe, the PMMA column will detach from the base during etching. Less severe backscattering will result in cavities with smaller volumes and correspondingly higher resonant frequencies.

Once the PMMA photoresist has been exposed and etched, the structure is copper plated until the un-etched PMMA is completely covered by the electrodeposited copper. As a result of the above constraints, neither the top nor the bottom surface of the electroplated LIGA part is suitable as the bottom wall of the Klystrino cavity. The bottom surface is roughened aluminum and the top surface still has the gold mask that was on top of the unexposed PMMA.

The number and complexity of the post-LIGA circuit fabrication steps are significantly increased due to the above issues. First, the top surface of the electrodeposited part must be machined (i.e., diamond flycut) to produce a flat reference plane for subsequent machining. Next, the aluminum is etched away in NaOH leaving a rough copper surface. The base of the cavities starts as a machined 1 mm thick copper sheet. Since brazing would leave fillets at the edges of the cavities that would modify the cavity frequencies, diffusion bonding is used to fuse the LIGA structure to the copper base. It is important that there are no unbonded areas at the edges of the cavities as that would lower the Q dramatically.

Once bonding is complete, the slots for the iron polepieces are cut using, for example, wire electrical discharge machining (EDM). It is important that the polepiece slots be aligned with the centerline of the cavities. The circuit with cavities and polepiece slots is then brazed to the cooling and support structure. Since this part houses the magnets, it also requires very accurate alignment with the RF circuit.

With all the brazing steps complete, the assembly is now ready for final machining. Final machining consists of three parts. First the LIGA section is machined to a height of 1 mm. The tuning rate for this dimension is 30 MHz/micron, so an error of 0.0002" in this operation will shift the cavity resonant frequencies by 150 MHz. The second step is the milling of the beam tunnel. A ball endmill can be used to cut the 800 micron diameter beam tunnel into each half of the Klystrino circuit. The final machining operation cuts the coupling irises for the input and output waveguides, the coupling slots for the five-gap output cavity, the input and output waveguides and the vacuum pumpout channels to eliminate gas pockets. Measurements of intrinsic Q's for the LIGA fabricated cavities ranged from 1300 to 1500.

At this point in the fabrication process, the cavity frequencies can be measured in cold test to determine if any frequency adjustment is necessary. For example, in the original Klystrino it was determined that several cavities needed to be tuned. This was done using a 0.010" end mill in a high speed spindle on a CNC mill. One half of the circuit was machined to produce half the desired change in resonant frequency. The parts were cold tested again and the volume of material to be removed in the opposite circuit half was adjusted based on the cold test results. Cavities which resonated at a lower frequency than desired were adjusted by increasing the width of the gap. Cavities with higher than desired frequencies were adjusted by cutting a racetrack slot in the back wall of the cavity to increase cavity volume.

Once the resonant frequencies were achieved, the magnets and polepieces were inserted into the two cavity halves. The circuit halves were bolted together and the sides and ends of the cavity block were machined to accept the waveguides and gun polepiece. Additional parts such as the electron gun and collector are then attached. The completed Klystrino is installed in a vacuum vessel that is evacuated or into a vacuum package that is evacuated and sealed. This technique also applies to other types of devices including, but not limited to, traveling wave tubes (TWTs), back wave oscillators (BWOs), magnetrons, klystrons, and other millimeter wave and microwave devices.

Electromagnetic radiation sources at millimeter wavelengths encounter significant problems during manufacturing for two reasons. First, the device dimensions vary inversely with operating frequency. Second, as the frequency increases, skin depths shrink and circuit losses increase. This means that the surface finish of the electromagnetic circuits must be improved while the fabrication tolerances become more difficult to achieve. These problems suggest the need for alternative circuit fabrication methods that are significantly different from conventional lathe and mill machining used in lower frequency devices.

Thus, there still exists a need in the art for improved vacuum compatible high frequency electromagnetic and millimeter wave sources, methods of micro-fabricating devices including vacuum compatible high frequency electromagnetic wave sources.

BRIEF SUMMARY OF THE INVENTION

An embodiment of a method of micro-fabricating high frequency electromagnetic wave source components is disclosed according to the present invention. The method may include providing a substrate, providing a UV-curable photoresist, using the UV-curable photoresist and photolithography to define high frequency electromagnetic wave source components, such as an output cavity, a waveguide and an alignment feature on the substrate. The embodiment of the method may further include using the UV-curable photoresist and photolithography to define additional high frequency electromagnetic wave source components, such as a coupling slot, a waveguide iris and a pumpout feature on the substrate.

An embodiment of a method of micro-fabricating a high frequency electromagnetic wave source magnetic circuit according to the present invention is disclosed. The embodiment of the method may include providing a plurality of polepieces and providing a copper circuit block having predefined water-cooling passages and configured to accept the plurality of polepieces. The method may further include brazing the plurality-of polepieces to the copper circuit block to obtain a vacuum tight assembly having the plurality of polepieces extending from a surface of the copper circuit block, flowing a UV-curable photoresist around the plurality of polepieces extending from the surface of the copper circuit block and photolithographically forming at least one high frequency electromagnetic wave source component using the UV-curable photoresist.

An embodiment of a method of micro-fabricating a high frequency electromagnetic wave source magnetic circuit according to the present invention is disclosed. The method may include providing a copper substrate assembly, providing a plurality of polepieces and brazing the plurality of polepieces to the copper substrate assembly. The method may further include flowing a layer of UV-curable photoresist on the copper substrate assembly and in between the plurality of polepieces and photolithographically forming at least one of an output cavity and a waveguide using the UV-curable photoresist.

BRIEF DESCRIPTION OF THE SEVERAL VIEWS OF THE DRAWINGS

The following drawings illustrate exemplary embodiments for carrying out the invention. Like reference numerals refer to like parts in different views or embodiments of the present invention in the drawings.

DETAILED DESCRIPTION OF THE INVENTION

Figure 1:
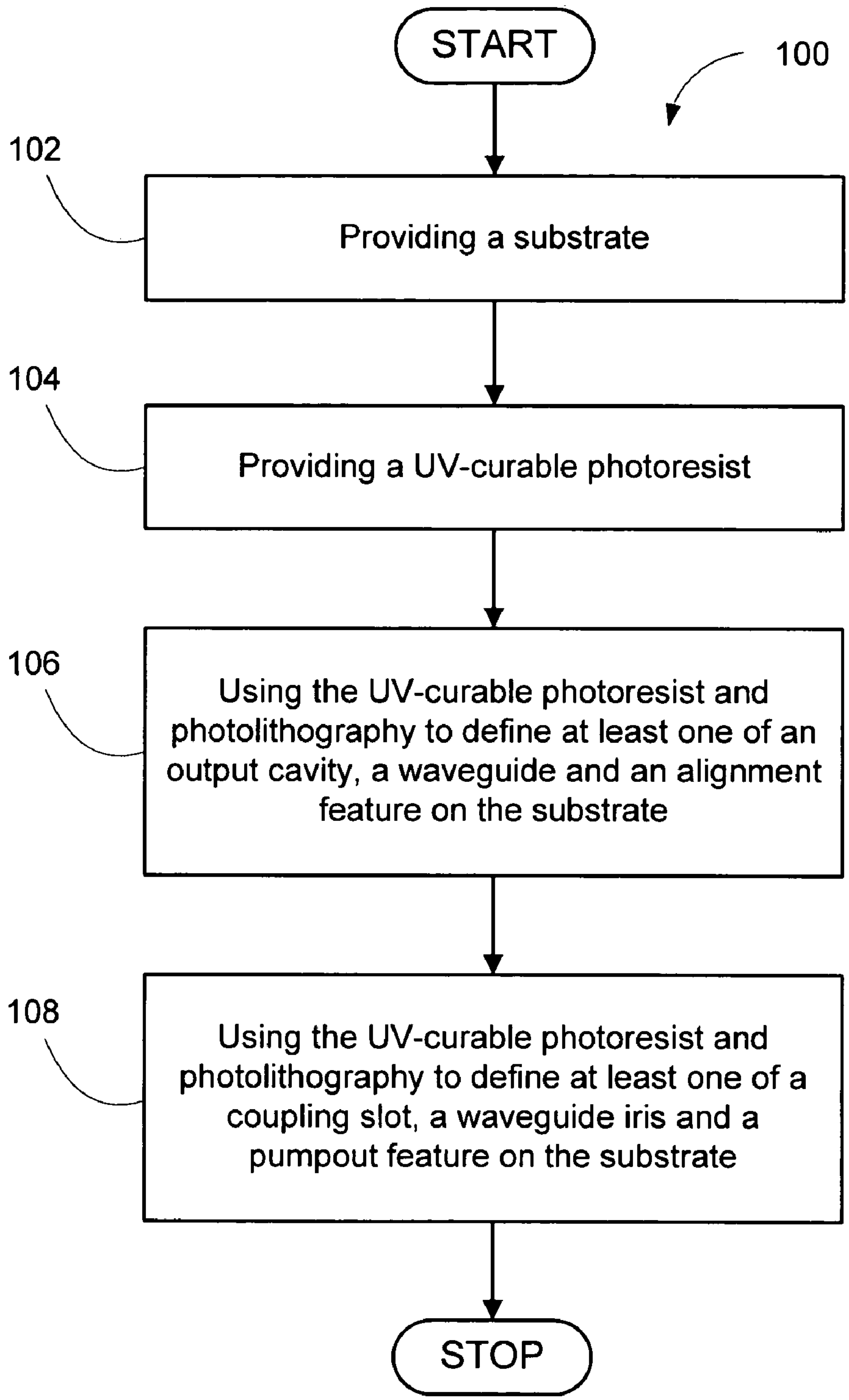
FIG. 1 is a flowchart of an embodiment of a method of micro-fabricating high frequency electromagnetic wave source components according to the present invention.

Micro-fabrication techniques adapted from semiconductor manufacturing and micromachining have been modified to manufacture precise high frequency electromagnetic wave vacuum electron devices. These micro-fabrication techniques involve lithography and are inherently planar in nature, i.e., the circuit fabrication starts with a flat substrate and adds and removes material defined by lithographic masks. While the micro-fabrication techniques disclosed herein are inherently planar in nature, they are capable of forming multiple layer structures having three dimensional characteristics suitable for the inventive high frequency electromagnetic wave vacuum electron devices. For certain embodiments of vacuum electronic devices disclosed herein, components may be fabricated in two or more sections that are subsequently bonded or otherwise assembled together to form the final assembly. This approach to circuit fabrication tends not to be compatible with the standard periodic permanent magnet (PPM) focusing schemes used in lower frequency tube designs. In those conventional designs the polepieces for the magnetic circuit are usually made as an integral part of the vacuum envelope.

In contrast, conventional lithographically fabricated devices have either used solenoidal or single permanent magnet focusing or the polepieces are inserted through the circuit and the whole assembly is enclosed in an external vacuum vessel. In both cases, the small size of the millimeter wave sources is compromised by the large focusing system.

The modified micro-fabrication process disclosed and referred to herein as "SU-8 LIGA-like" includes lithography and electroplating and may use, for example, a negative-photoresist epoxy, SU-8 in place of LIGA's normal PMMA photoresist. Since SU-8 can be exposed using UV light, a source of synchrotron radiation is not needed to perform the exposure. Tests have shown the surface finish of SU-8 LIGA-like process based structures to be very close to X-ray exposed PMMA surfaces. This means that the desirable low loss characteristics of the structures are maintained.

SU-8 LIGA-like process circuit micro-fabrication and several alternative methods of fabricating the PPM magnetic circuit as an integral part of the vacuum envelope may be used to produce devices of the desired precision. The processes disclosed herein allow automated fabrication of high frequency electromagnetic wave devices, significantly improving both device performance and cost.

An embodiment of a method of constructing electroconductive structures using UV-curable photoresist polymers to form structures up to one millimeter high or higher adhered to a copper substrate is disclosed.

In contrast to conventional LIGA processing to produce tall/narrow electroconductive structures, embodiments of the SU-8 LIGA-like process utilize, for example, SU-8 photoresist material composed of an epoxy material which is degraded by UV radiation (as well as X-Ray) and enables the use of a copper (Cu) substrate. The UV exposure aspect of the method of the present invention eliminates backscattering that occurs when X-Rays are used. Additionally, the X-rays reflect from high atomic number substrate materials such as Cu. Thus, with an embodiment of the method of the present invention, a Cu substrate can be used instead of Al and one diamond flycut step of the LIGA process eliminated. Also, the mask can be formed of chromium versus gold, thus, reducing material costs in addition to other advantages of the present invention. Further, the mask need not be bonded to the photoresist and depending on the details of the part or component to be fabricated, only one-exposure may be required to expose the 1 mm thick SU-8 layer.

An embodiment of an alternate fabrication method is also disclosed herein that maintains the beneficial features inherent in the LIGA process and eliminates most if not all of the delicate post-LIGA machining that made, for example, the Klystrino difficult to build. The new approach uses SU-8 as the photoresist in LIGA-like processes. SU-8 is an epoxy photoresist that is sensitive to both X-rays and UV. SU-8 is some 200 times more sensitive to X-ray photons than PMMA. A major consequence of using SU-8 instead of PMMA is that a UV light source can be used instead of a synchrotron light source. A UV exposure eliminates the X-ray problems due to backscattering from high atomic number substrate materials such as copper. Thus, a copper substrate can be used thereby eliminating one diamond flycut of the conventional LIGA process and the diffusion bonding to the copper base. Since the mask for the UV exposure can be a standard chrome mask, the 25 micron thick gold mask is not required. The mask of the present invention does not need to be bonded to the photoresist as, for example, only one exposure is required to completely expose the 1 mm thick SU-8.

Embodiments of the novel SU-8 LIGA-like process, (e.g., see FIGS. 1-3 and related description of method 100, below), enable micro-fabrication and construction of relatively tall (i.e., less than typically a few microns to greater than 1 mm) structures specifically designed for applications such as high frequency (microwave and millimeter wave) devices, circuits, and systems including traveling wave, klystron amplifiers and other similar electromagnetic devices.

The SU-8 LIGA-like process was conceived and designed at the outset to not require the conventional LIGA process of radiation exposure via the use of a synchrotron radiation source and facility. There are relatively few such synchrotron source facilities in the world and the relatively high cost, considerable effort and inconvenience typically precludes their use in most applications, especially those involving routine, high volume, low cost manufacturing. The technology that has been developed and disclosed herein is capable of being performed in literally thousands of locations throughout the world at a cost which is a very small fraction of that associated with the conventional LIGA process and a convenience factor and level that is typically associated with ordinary micro-fabrication, micro-electrical-mechanical systems (MEMS) and micromachining. While the disclosed embodiments of high frequency electromagnetic wave sources include microwave and millimeter wave devices, it will be understood that the SU-8 LIGA-like process technology of the present invention has vast applications beyond those directly associated and connected with microwave and millimeter wave devices. Those skilled in the art will recognize that there are a number of applications for the embodiments of the present invention in, for example, sensor and microelectronics applications and other vacuum electronics devices and applications including slow wave structures in coupled cavity, coupled cavities, helical traveling wave tube, traveling wave tube amplifiers, backward wave oscillators, and other types of velocity modulated structures.

While the high frequency electromagnetic wave source components disclosed in the following embodiments are particularly related to the construction of a Klystrino, it will be readily apparent to one of skill in the art that the methods disclosed herein are also suitable for forming slow wave structures and parts thereof as well as coupled cavities and associated parts and components for use in, for example, traveling wave tubes and related devices.

As an example of the SU-8 LIGA-like process technology disclosed herein, a two-mask SU-8 LIGA-like process may be implemented, (e.g., see FIGS. 1-3 and related description of method 100, below). In this case, the first mask defines the geometry of the bottoms of the cavities, the waveguides, and the alignment features. The second mask defines the coupling slots, waveguide irises, pumpout features, etc. The first layer geometry is about 400 microns deep and the second layer completes the 1 mm deep cavity features. This process eliminates the machining of all these features and improves their alignment with respect to the rest of the circuit geometry.

FIG. 1 is a flowchart of an embodiment of a method 100 of micro-fabricating high frequency electromagnetic wave source components according to the present invention. Method 100 may include providing 102 a substrate and providing 104 a UV-curable photoresist. The substrate may be of any suitable metal, elemental or alloy, according to embodiments of the present invention. In one embodiment the substrate may be formed of copper. According to other embodiments, the substrate may be formed of a semiconductor, such as silicon. In yet other embodiments according to the present invention, the substrate may be formed of an insulator or an insulator having a layer of an electrically conductive material on a surface of the insulator. Of course, one skilled in the art will recognize that other combinations and sub-combinations of layers of metal, insulator and semiconductor may be formed to provide a substrate consistent with embodiments of the present invention. The UV-curable photoresist may be any suitable photoresist configured for being exposed by UV light meeting the requirements of the fabricated product. According to an embodiment of the present invention, the UV-curable photoresist may be SU-8. SU-8 photoresist is a negative, epoxy-type, near-UV photoresist based on EPON SU-8 epoxy resin sourced from Shell Chemical that has been originally developed and patented by IBM. SU-8 photoresist can be as thick as 2 mm. SU-8 is available from MicroChem Inc., 1254 Chestnut Street, Newton, Mass. 02164-1418, under the name SU-8 with various viscosities. SU-8 is also available from Gerstel SA 19 Ben-Zion, 54286 Tel-Aviv, Israel, under the names GM1040, GM1060, GM1070 and GLM2060.

Method 100 may further include a method of using 106 a UV-curable photoresist and photolithography to define at least one of an output cavity, a waveguide and an alignment feature on the substrate according to an embodiment of method 100. Of course, a plurality of output cavities, waveguide features and alignment features may be defined consistent with embodiments of method 100. The method of using 106 a UV-curable photoresist to photolithographically define such high frequency electromagnetic wave source components may include placing the UV-curable photoresist on the substrate, masking the UV-curable photoresist to define the components, exposing the UV-curable photoresist, removing the uncured photoresist and depositing electrically conductive layers to complete the formation of the defined high frequency electromagnetic wave source components.

Figure 2:
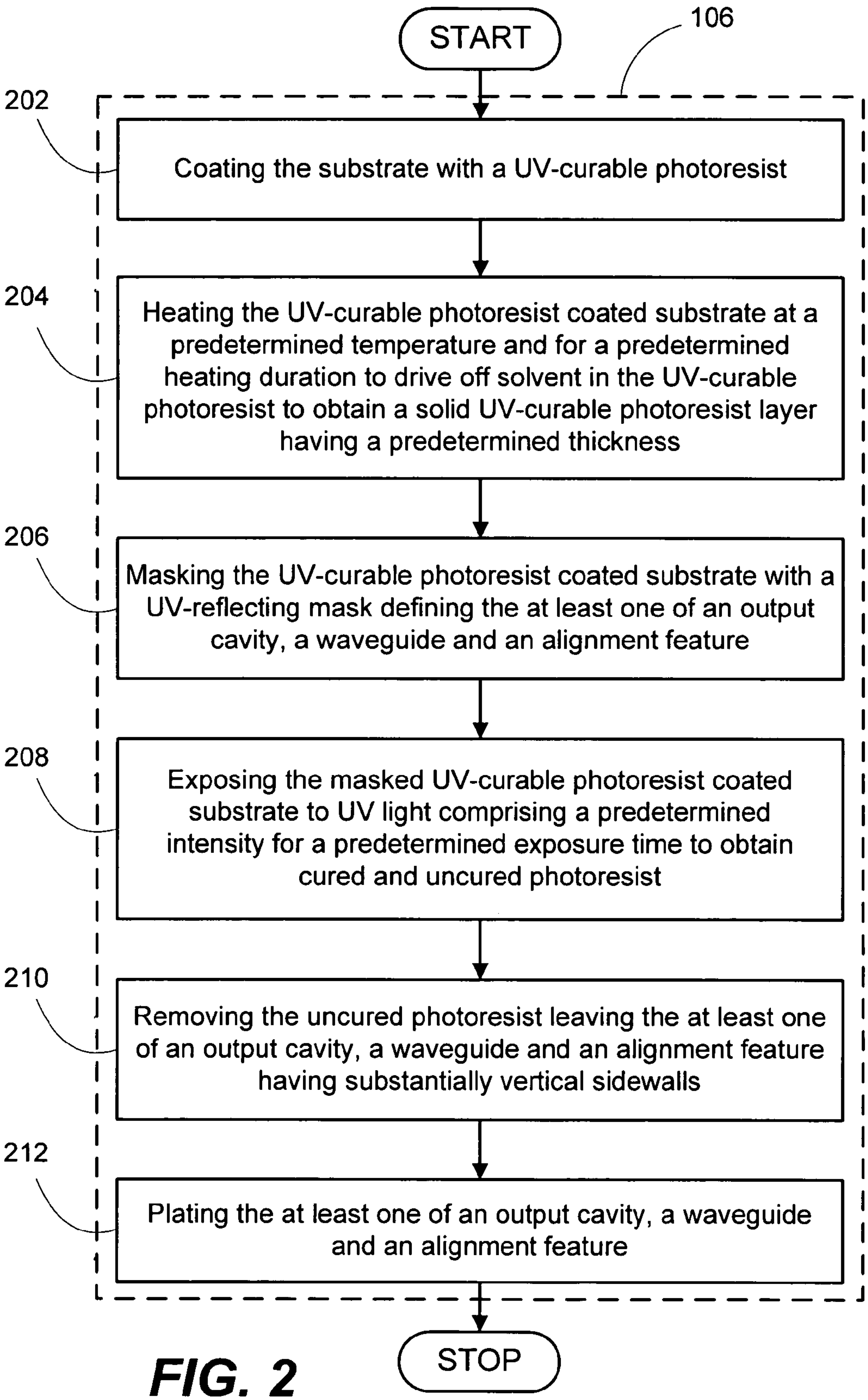
FIG. 2 is a flow chart of an embodiment of a method of using a UV-curable photoresist to photolithographically define high frequency electromagnetic wave source components such as an output cavity, a waveguide or an alignment feature.

FIG. 2 is a flow chart of an embodiment of a method of using 106 a UV-curable photoresist to photolithographically define high frequency electromagnetic wave source components such as an output cavity, a waveguide or an alignment feature. The embodiment of a method of using 106 a UV-curable photoresist may include coating 202 the substrate with a UV-curable photoresist and heating 204 the UV-curable photoresist coated substrate at a predetermined temperature and for a predetermined heating duration to drive off solvent in the UV-curable photoresist to obtain a solid UV-curable photoresist layer having a predetermined thickness. The embodiment of a method of using 106 a UV-curable photoresist to photolithographically define such high frequency electromagnetic wave source components may further include masking 206 the UV-curable photoresist coated substrate with a UV-reflecting mask defining the at least one of an output cavity, a waveguide and an alignment feature and exposing 208 the masked UV-curable photoresist coated substrate to UV light comprising a predetermined intensity for a predetermined exposure time to obtain cured and uncured photoresist. The embodiment of a method of using 106 a UV-curable photoresist to photolithographically define such high frequency electromagnetic wave source components may further include removing 210 the uncured photoresist leaving at least one of an output cavity, a waveguide and an alignment feature having substantially vertical sidewalls and plating 212 at least one of an output cavity, a waveguide and an alignment feature.

Having formed the desired selection of output cavities, waveguide features and alignment features on the substrate, method 100 may further include using 108 a UV-curable photoresist and photolithography to define at least one of a coupling slot, a waveguide iris and a pumpout feature on the substrate. The UV-curable photoresist may be SU-8 photoresist according to embodiments of method 100. Of course other embodiments of method 100 may include defining a plurality of coupling slots, waveguide irises and pumpout features on the substrate that already has the desired selection of output cavities, waveguide features and alignment features. Again, using 108 a UV-curable photoresist to photolithographically define a desired combination of coupling slots, waveguide irises and pumpout features may be accomplished by placing the UV-curable photoresist on the substrate, masking the UV-curable photoresist to define the components, exposing the UV-curable photoresist, removing the uncured photoresist and depositing electrically conductive layers to complete the formation of the defined high frequency electromagnetic wave source components.

Figure 3:
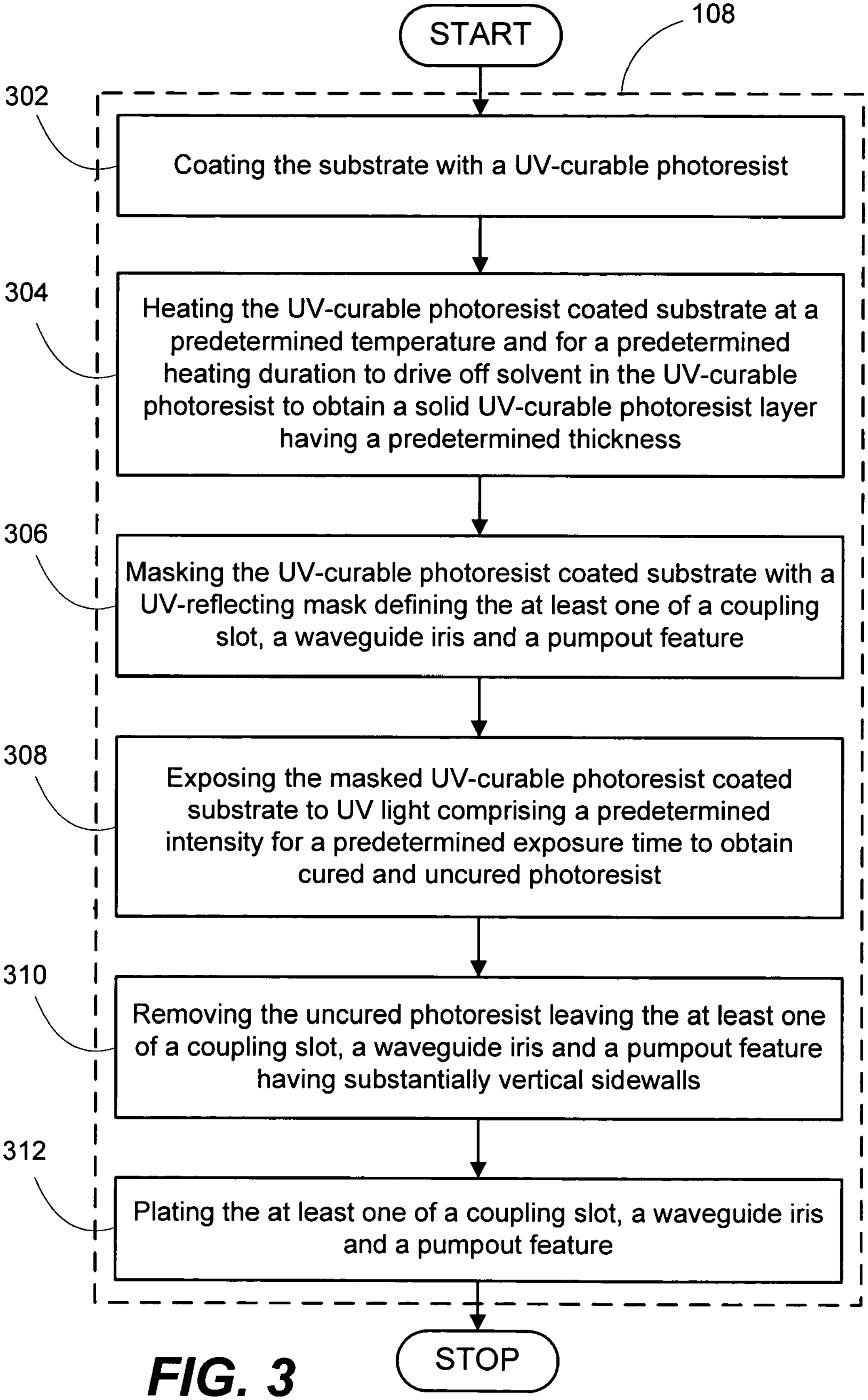
FIG. 3 is a flowchart of another embodiment of a method of using a UV-curable photoresist to photolithographically define a desired combination of coupling slots, waveguide irises and pumpout features according to the present invention.

FIG. 3 is a flowchart of another embodiment of a method of using 108 a UV-curable photoresist to photolithographically define a desired combination of coupling slots, waveguide irises and pumpout features according to the present invention. The embodiment of a method of using 108 a UV-curable photoresist to photolithographically define such high frequency electromagnetic wave source components may include coating 302 the substrate with a UV-curable photoresist and heating 304 the UV-curable photoresist coated substrate at a predetermined temperature and for a predetermined heating duration to drive off solvent in the UV-curable photoresist to obtain a solid UV-curable photoresist layer having a predetermined thickness. The embodiment of a method of using 108 a UV-curable photoresist to photolithographically define such high frequency electromagnetic wave source components may further include masking 306 the UV-curable photoresist coated substrate with a UV-reflecting mask defining the at least one of a coupling slot, a waveguide iris and a pumpout feature and exposing 308 the masked UV-curable photoresist coated substrate to UV light comprising a predetermined intensity for a predetermined exposure time to obtain cured and uncured photoresist. The embodiment of a method of using 108 a UV-curable photoresist to photolithographically define such high frequency electromagnetic wave source components may further include removing 310 the uncured photoresist leaving the at least one of a coupling slot, a waveguide iris and a pumpout feature having substantially vertical sidewalls and plating 312 the at least one of a coupling slot, a waveguide iris and a pumpout feature.

In still another embodiment of method 100 may further include separating the substrate from the high frequency electromagnetic wave source components, according to the present invention. Separating the substrate from the high frequency electromagnetic wave source components may be performed by etching, cutting and any other suitable method consistent with the principles of the present invention.

Figure 4:
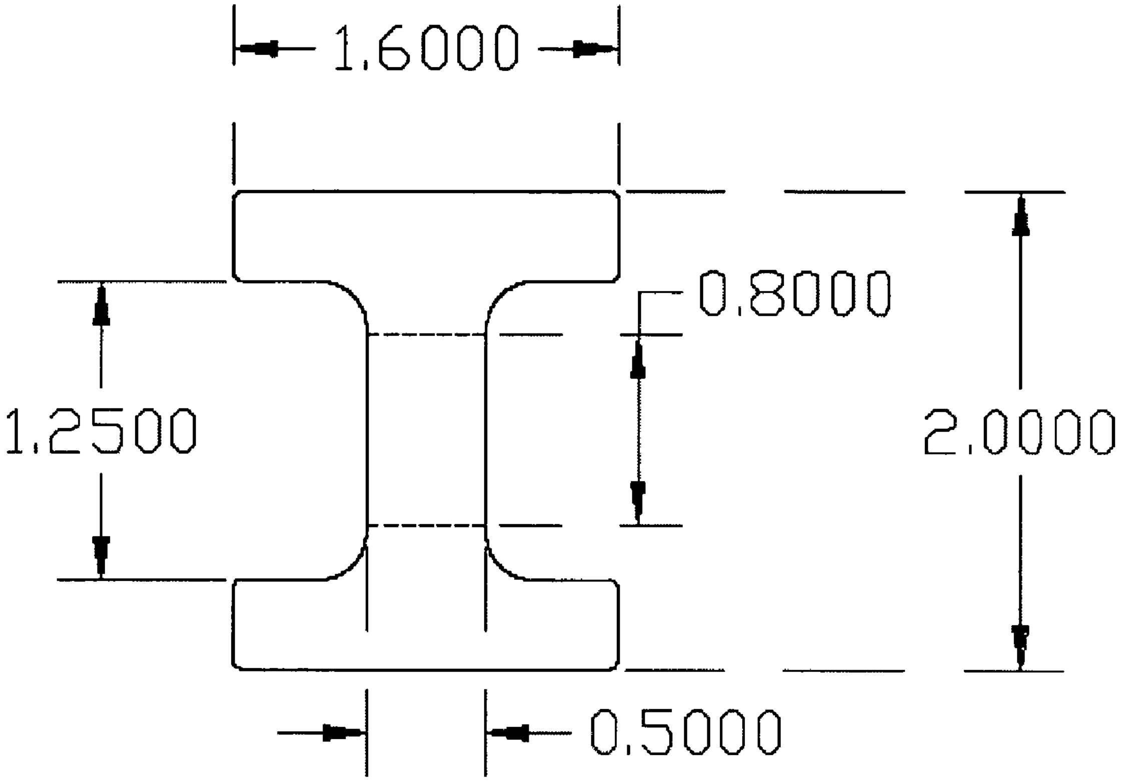
FIG. 4 illustrates an exemplary conventional Klystrino output cavity with dimensions shown in millimeters.

High frequency electromagnetic wave source components such as output cavities, waveguides, alignment features, coupling slots, waveguide irises and pumpout features, may be micro-fabricated according to embodiments of the present invention. FIG. 4 illustrates one exemplary conventional Klystrino output cavity with dimensions shown in millimeters as disclosed in the prior art. An embodiment of method 100 of the present invention may be used to form such conventional structures as well as novel structures without resorting to conventional PMMA photoresist and conventional synchrotron X-ray sources for performing the mask and exposure steps inherent with the LIGA process.

Figure 5:
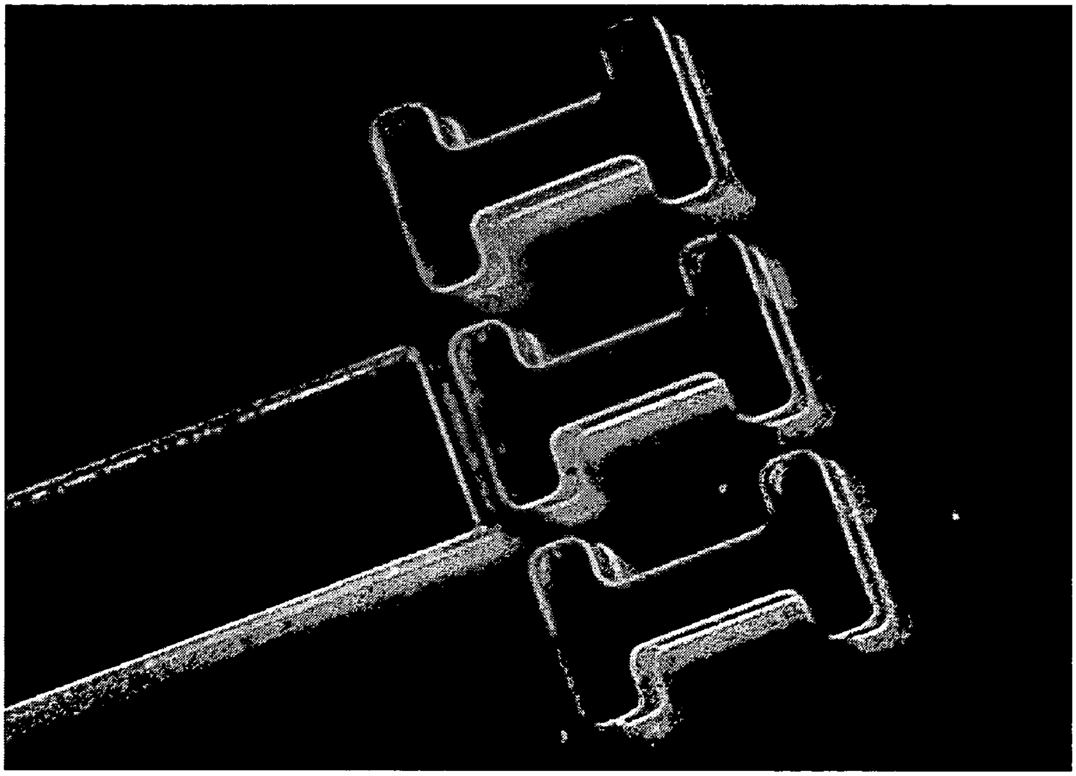
FIG. 5 illustrates an optical microscope photograph of UV-curable photoresist formed as Klystrino output cavity shapes micro-fabricated to the dimensions shown in FIG. 4.

FIG. 5 illustrates an optical microscope photograph of UV-curable photoresist formed as Klystrino output cavity shapes micro-fabricated to the dimensions shown in FIG. 4. More particularly, FIG. 5 shows a 1 mm thick patterned SU-8 layer in the shape of 3 Klystrino output cavities on top of-a copper (Cu) substrate. Such structures may be plated to an exact height according to embodiments of the present invention.

Figure 6:
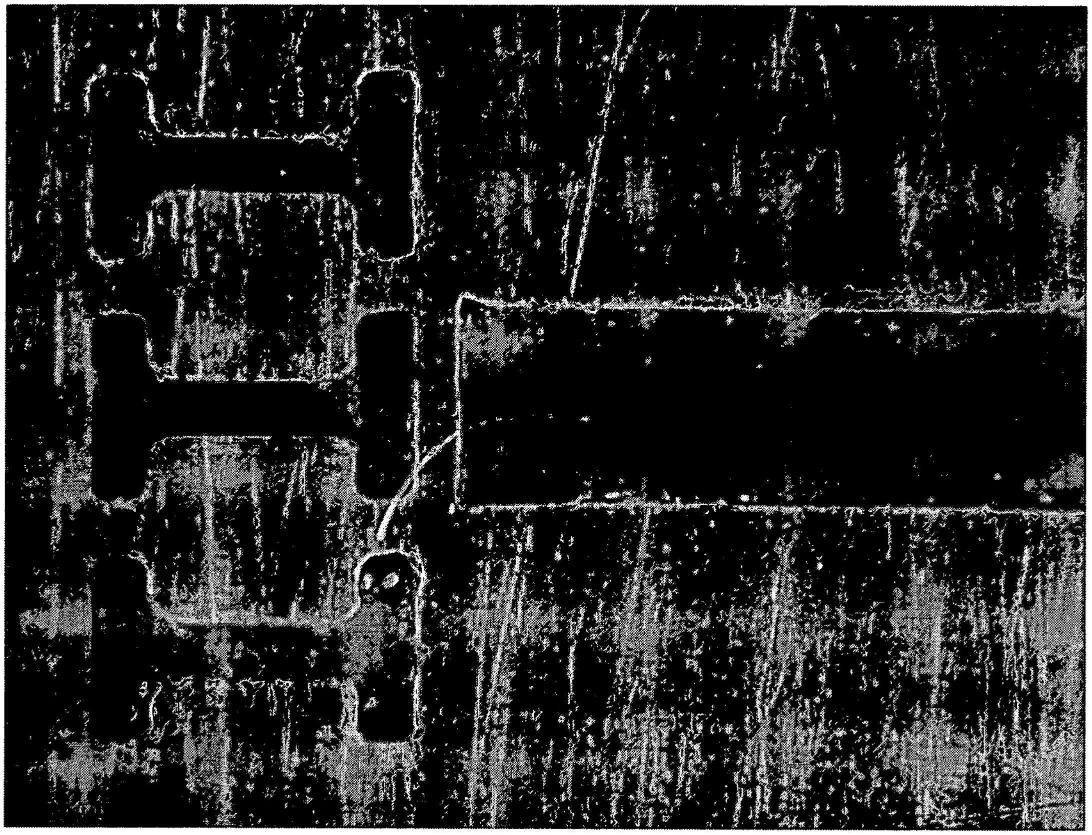
FIG. 6 illustrates an optical microscope photograph illustrating a top view of the Klystrino output cavities shown in FIG. 5 after copper electroplating.

FIG. 6 is an optical microscope photograph illustrating a top view of the Klystrino output cavities shown in FIG. 5 after copper electroplating. More particularly, the Klystrino output cavities are surrounded by electroplated copper surface areas that are approximately 1 mm above the copper substrate. Measurements of surface roughness performed on exemplary SU-8 LIGA-like structures were less than 200 nm. This surface roughness is comparable to X-ray PMMA LIGA fabricated surface roughness.

The Klystrino output cavities shown in FIG. 5 were formed on a copper substrate approximately six mm thick and 15 mm by 15 mm on the edges that was coated with a solvent-based liquid SU-8 photoresist to a thickness greater than 1 mm. The solvent in the SU-8 photoresist was removed by baking at a temperature of about 100° C. to form a solid non-cured, rigid polymer. A chromium mask of a selected pattern was applied to the top surface of the solid polymer and the masked polymer was then exposed to UV light having a wavelength of about 270 nm to about 400 nm for a period of typically not more than a few minutes.

Successful exposure was achieved by intermittent UV light exposure in bursts of about two seconds in duration. When the exposed polymer was cured under the UV light, the chromium mask was removed and the unexposed polymer was removed with a solvent such as cyclopentanone. A sculpted solid polymerized polymer remained having a cavity of at least a few microns to greater than one mm in depth with the shape and dimensions of the chromium mask (see FIG. 4). The cavity base was the copper substrate. Copper was then electroplated into the exposed substrate to fill the shaped cavity to form an output cavity of a slow wave device.

The technique of the instant invention is very versatile in that high atomic number metals such as Cu, Ni, Au, Ag, W, Mo, Ta, Ti, alloys of these metals and other materials may be used as substrates. The UV-curable photoresist may be applied to form various depths of coating, up to one millimeter and more. Furthermore, the solid, uncured photoresist does not require exotic, expensive masks such as those formed of gold. Rather, metals such as chromium and other non-contact masks and the like may be used. In addition to conventional masks and masking techniques, binary or digital masks or gray scale masks may also be used according to embodiments of the present invention. These latter types of masks are suited to and facilitate the formation of various three-dimensional (3D) features to produce slow wave structures, e.g., solid state vacuum devices (SSVDs), traveling wave tube amplifiers (TWTAs), klystrons, Klystrinos, back wave oscillators (BWOs), magnetrons, triodes, diodes, tetrodes and the like.

More than one mask may be used either concurrently or sequentially, and more than one photoresist layer of the same or a different material can be used. Specialized features can be made by various combinations of masks and photoresist materials.

Figure 7:
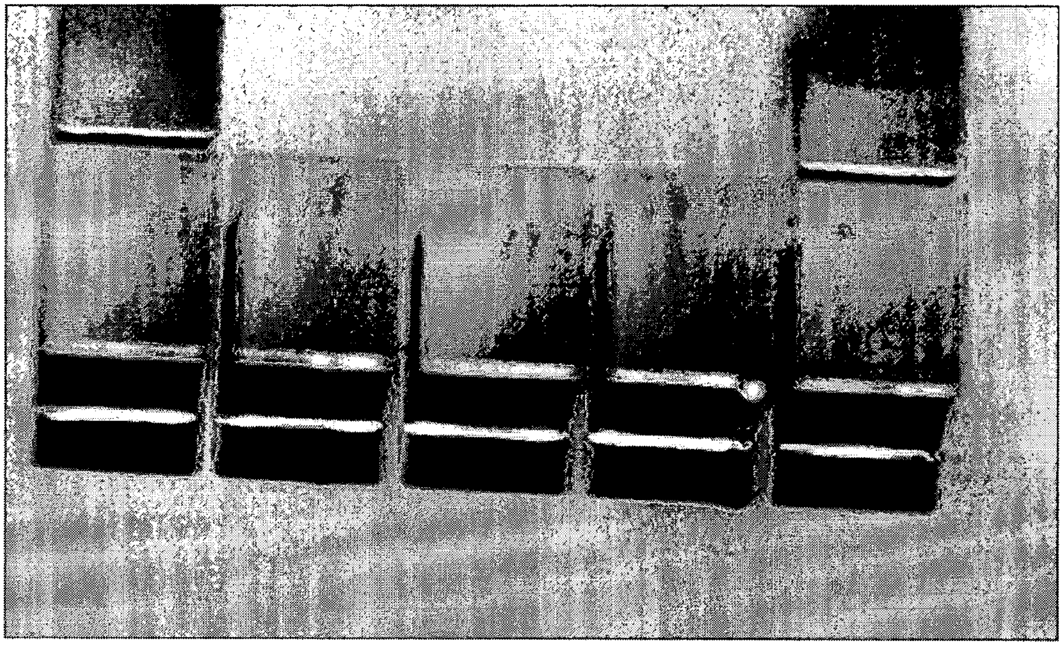
FIG. 7 illustrates an optical microscope photograph of arbitrary test structures formed using an embodiment of the method of micro-fabricating high frequency electromagnetic wave source components according to the present invention.

FIG. 7 is an optical microscope photograph of arbitrary test structures formed using an embodiment of the method 100 of micro-fabricating high frequency electromagnetic wave source components according to the present invention. More particularly, FIG. 7 illustrates a plurality of 1.1 mm tall structures coated with copper according to an embodiment of method 100.

Figure 8:
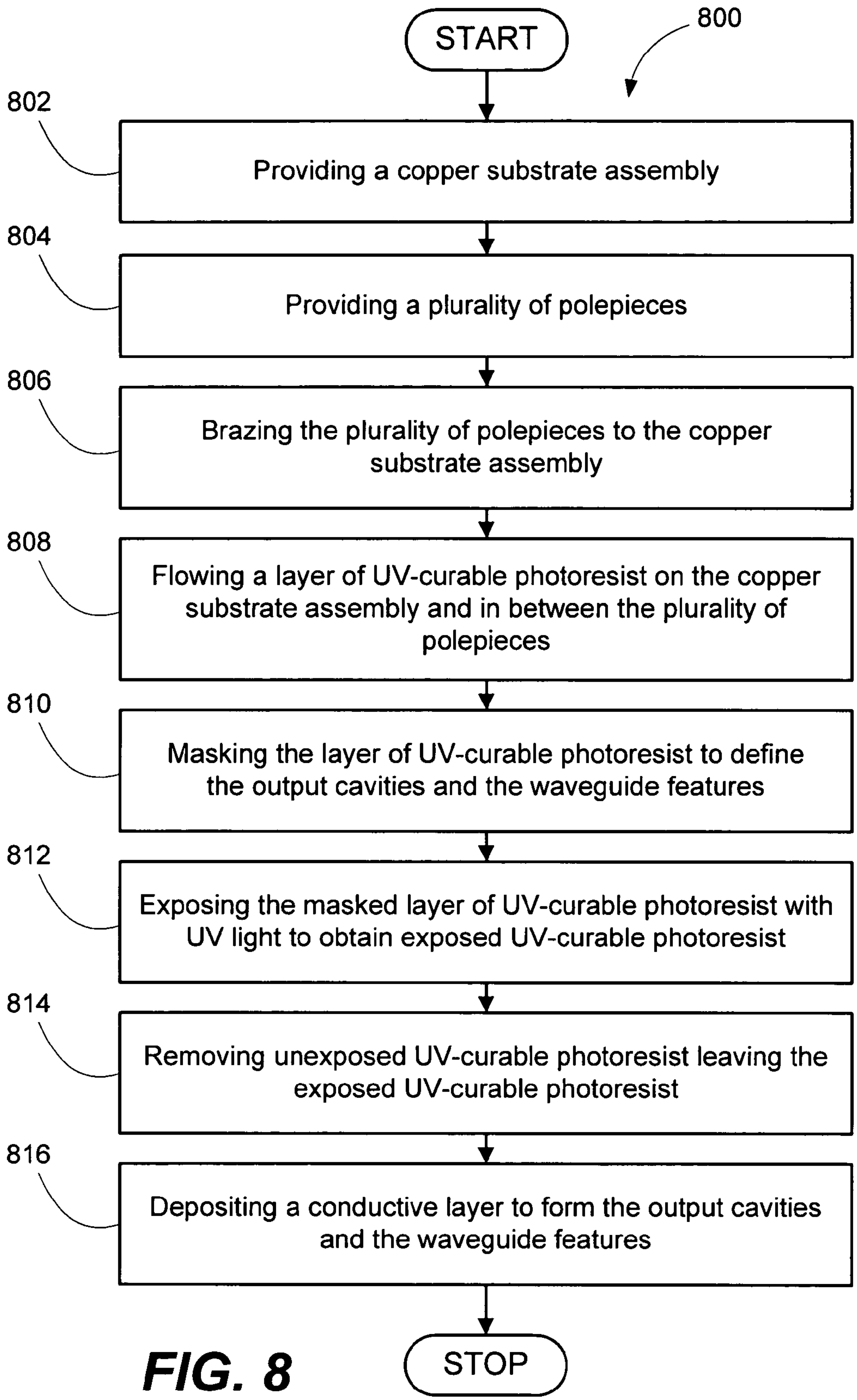
FIG. 8 is a flowchart of an embodiment of a method of micro-fabricating a high frequency electromagnetic wave source magnetic circuit according to the present invention.

FIG. 8 is a flowchart of an embodiment of a method 800 of micro-fabricating a high frequency electromagnetic wave source magnetic circuit according to the present invention. Method 800 may include providing 802 a copper substrate assembly, providing 804 a plurality of polepieces and brazing 806 the plurality of polepieces to the copper substrate assembly. Method 800 may further include flowing 808 a layer of UV-curable photoresist on the copper substrate assembly and in between the plurality of polepieces and photolithographically forming at least one of an output cavity and a waveguide using said UV-curable photoresist.

According to another embodiment of method 800, photolithographically forming at least one of an output cavity and a waveguide using the UV-curable photoresist may include masking 810 the layer of UV-curable photoresist to define the output cavities and the waveguide features. This embodiment of method 800 may further include exposing 812 the masked layer of UV-curable photoresist with UV light to obtain exposed UV-curable photoresist, removing 814 unexposed UV-curable photoresist leaving the exposed UV-curable photoresist and depositing 816 a conductive layer to form the output cavities and the waveguide features.

According to yet another embodiment of method 800 providing a plurality of polepieces 804 may include machining, micromachining, or using other such fabrication methods, a plurality of uniformly spaced, perpendicular polepieces from an iron block leaving a web at a base to maintain proper orientation of said plurality of polepieces. This embodiment of method 800 may further include machining away the web from the plurality of polepieces and machining pockets in the conductive layer to accept and align magnets according to the present invention.

The conductive layer may be formed of copper or any other suitable conductive material according to other embodiments of method 800. The UV-curable photoresist may be SU-8 according to an embodiment of method 800. Other UV-curable photoresists having characteristics similar to SU-8 may also be used in embodiments of method 800 according to the present invention.

Figure 9:
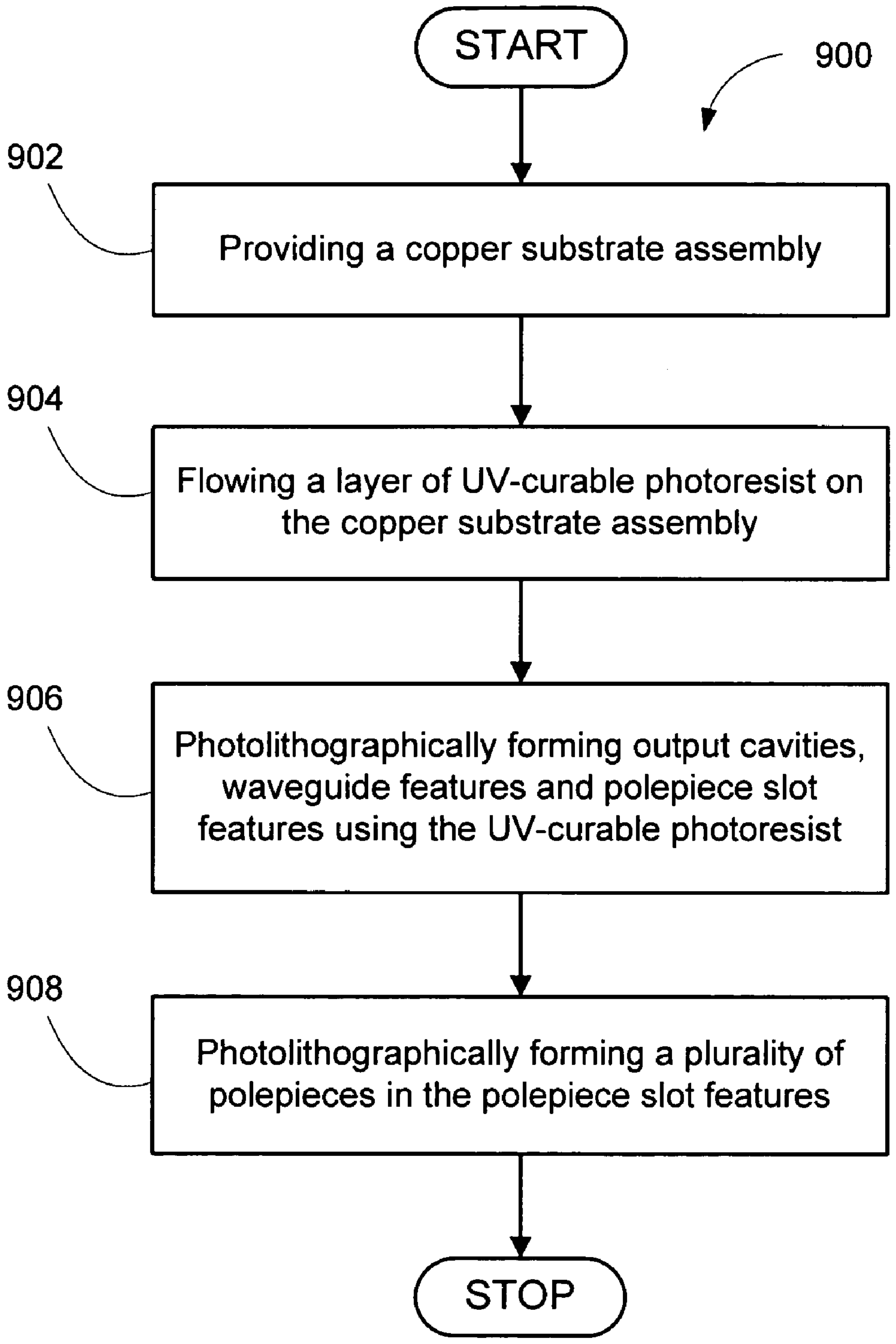
FIG. 9 is a flowchart of another embodiment of a method of micro-fabricating a high frequency electromagnetic wave source magnetic circuit according to the present invention.

FIG. 9 is a flowchart of another embodiment of a method 900 of micro-fabricating a high frequency electromagnetic wave source magnetic circuit according to the present invention. Method 900 may include providing 902 a copper substrate assembly and flowing 904 a layer of UV-curable photoresist on the copper substrate assembly. Method 900 may further include photolithographically forming 906 output cavities, waveguide features and polepiece slot features using the UV-curable photoresist and photolithographically forming 908 a plurality of polepieces in the polepiece slot features.

Figure 10:
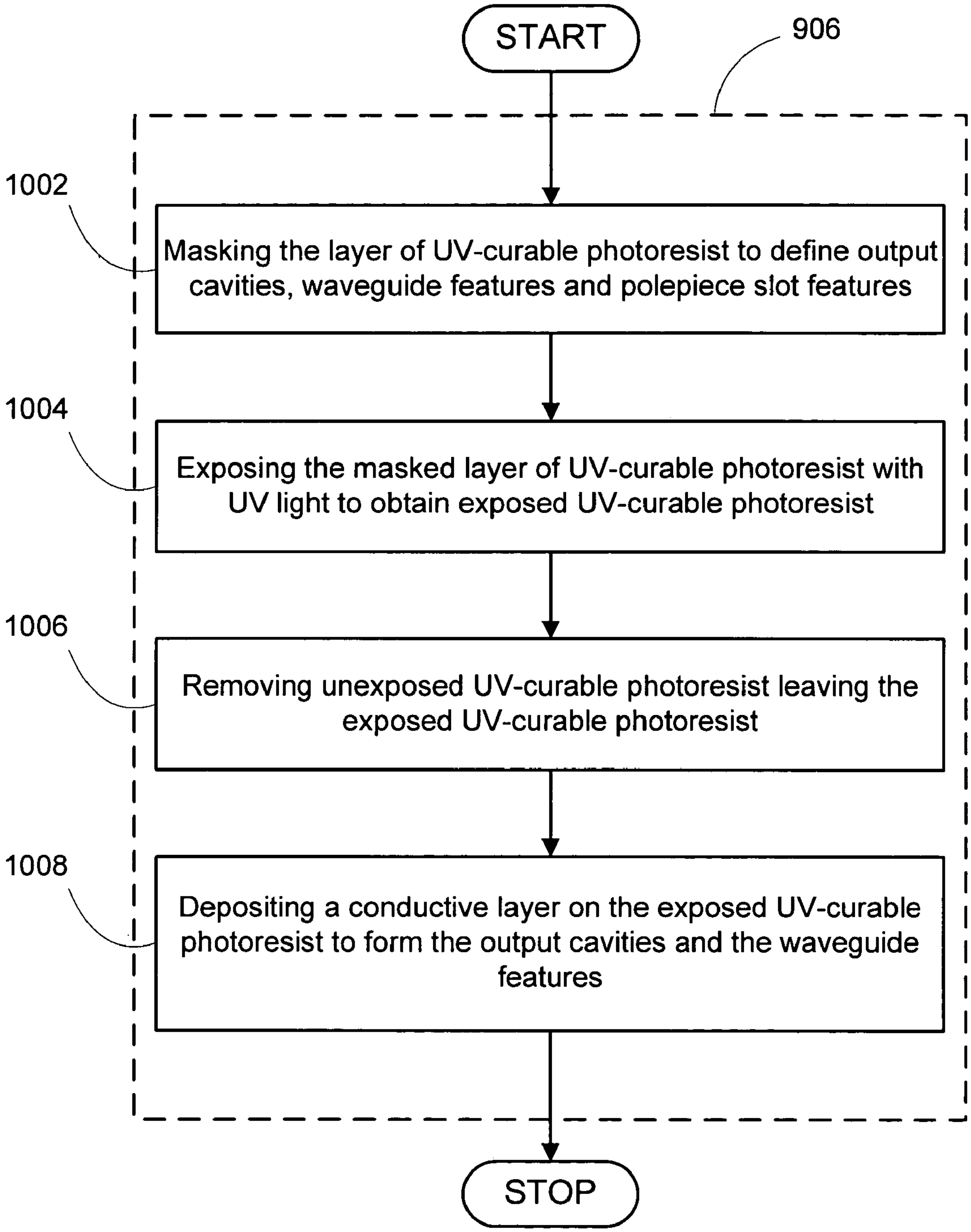
FIG. 10 is a flow chart of an embodiment of a method of photolithographically forming output cavities, waveguide features and polepiece slot features using a UV-curable photoresist according to the present invention.

FIG. 10 is a flow chart of an embodiment of a method of photolithographically forming 906 output cavities, waveguide features and polepiece slot features using a UV-curable photoresist according to the present invention. Method 906 may include masking 1002 a layer of UV-curable photoresist to define output cavities, waveguide features and polepiece slot features and exposing 1004 the masked layer of UV-curable photoresist with UV light to obtain exposed UV-curable photoresist. Method 906 may further include removing 1006 unexposed UV-curable photoresist leaving the exposed UV-curable photoresist and depositing 1008 a conductive layer on the exposed UV-curable photoresist to form the output cavities and the waveguide features.

Figure 11:
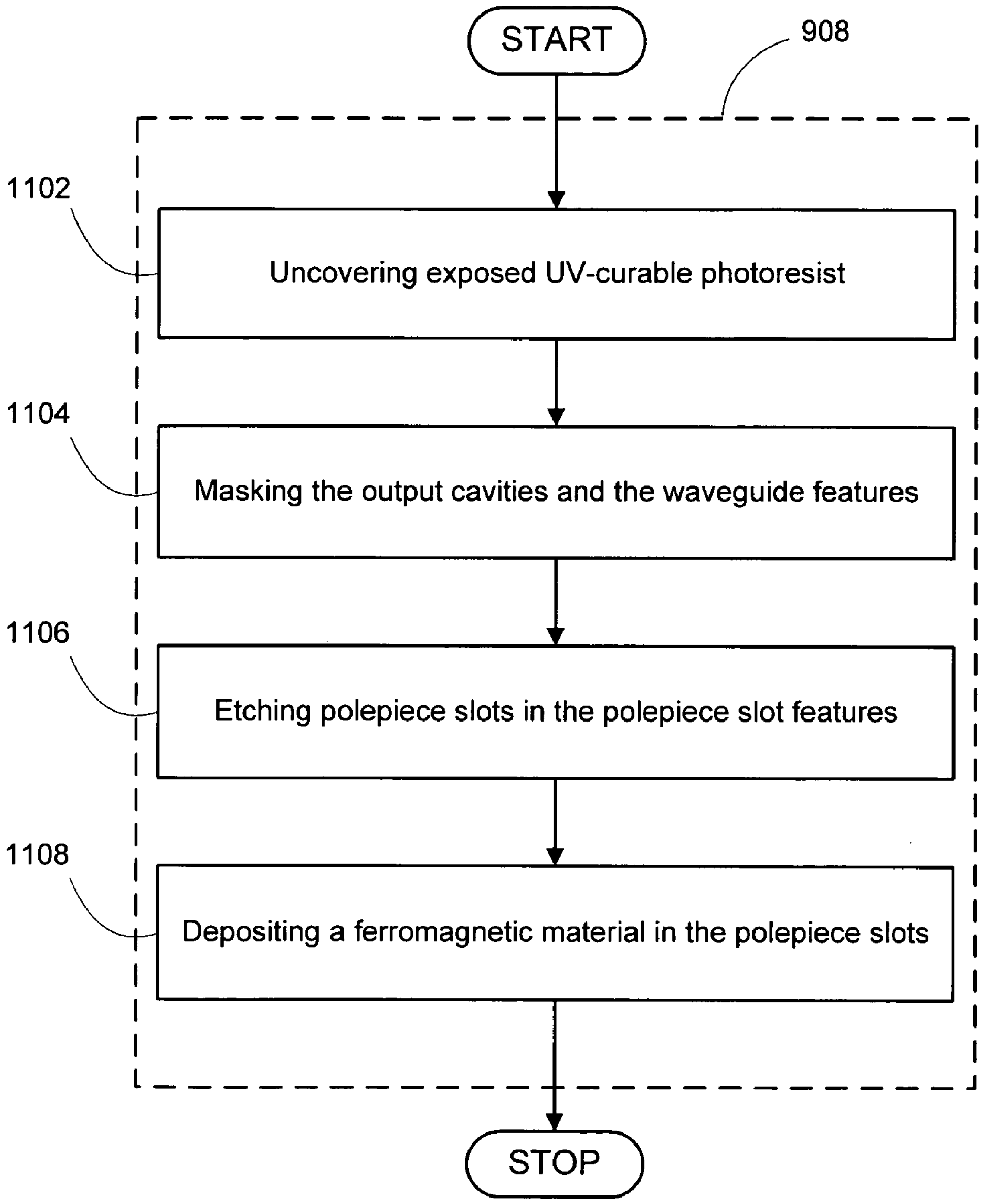
FIG. 11 is a flow chart of an embodiment of a method of photolithographically forming a plurality of polepieces in said polepiece slot features according to the present invention.

FIG. 11 is a flow chart of an embodiment of a method of photolithographically forming 908 a plurality of polepieces in said polepiece slot features according to the present invention. Method 908 may include uncovering 1102 exposed UV-curable photoresist and masking the output cavities and the waveguide features. Uncovering 1102 the exposed UV-curable photoresist may be accomplished by a diamond flycut, by etching or by any other suitable means for embodiments of the present invention. Method 908 may further include etching 1106 polepiece slots in the polepiece slot features and depositing 1108 a ferromagnetic material in the polepiece slots. The ferromagnetic material may be iron, iron alloy, Supermalloy or any other suitable ferromagnetic material in accordance with embodiments of the present invention.

A variety of high frequency electromagnetic wave source magnetic circuits and components may be formed according to embodiments of methods 100, 800 and 1100 of the present invention. Such high frequency electromagnetic wave source magnetic circuits and components may include output cavities, waveguides, polepieces and other features consistent with principles of the embodiments of the present invention. Additionally, various high frequency electromagnetic wave sources may be formed according to embodiments of methods 100, 800 and 1100 including, for example and not by way of limitation, a klystron, a millitron, a slow wave structure, one or more a coupled cavities, a traveling wave tube (TWT), a backward wave oscillator (BWO), an extended interaction amplifier (EIA), and, in general, vacuum electron devices.

The processes and methods disclosed herein may be repeated as many times as needed to define and create complex three dimensional features and structures and to create even taller (e.g., structures having height greater than 1 to 2 mm) features and structures.

An embodiment of a solid state vacuum device (SSVD) having a substrate of copper or other electroconductive metal or material typically, but not necessarily, having an atomic number greater than that of aluminum is disclosed. Adhered to the substrate is a UV-activated polymerized photo resist material having one or more cavities up to and even exceeding one millimeter depth between its top surface and the exposed copper substrate at the bottom of said-cavity. The cavity has substantially vertical sidewalls and the polymerized photoresist material has a uniformly smooth upper surface. Furthermore, an electroconductive metal (preferably in certain applications, the same metal as said substrate) may be deposited in the cavity or cavities in adherence to the substrate and to a depth equal to the depth of the cavity or cavities. The electroconductive metal may be, for example, adhered to the substrate by any of the following methods: electroplating, plating, chemical vapor deposition, sputtering and electron beam evaporation, other methods of physical vapor deposition and other deposition processes. Of course the above examples are by no means limiting and are given merely as illustrative examples. Certainly any technique or techniques that can accomplish such a requirement of the present invention are considered within the scope of the present invention. Relatively smaller or larger cavities and structures may also be formed according to embodiments of the present invention.

Another embodiment of a SSVD is disclosed. This embodiment of a SSVD may be constructed by placing a solvent-based liquid UV-curable polymer on a copper substrate or other electroconductive metals or materials which may or may not have an atomic number greater than that of aluminum to a depth typically between a few microns and to at least 1 mm. Heating the substrates and polymer to drive off the solvent to form a solid UV-curable polymer layer having a depth which can be up to at least one millimeter or more, placing a UV-reflecting mask of Cr (or similar metal) on the top surface of the solid polymer, exposing the masked polymer to UV light to cure the unmarked portions of the solid polymers, removing the mask and dissolving the uncured polymer with an appropriate solvent to leave cavities in the cured polymer of a defined cross-section and having substantially straight vertical sidewalls, electrodepositing an electroconductive metal(s) or material(s) or using other means and techniques in the cavities to adhere same to the substrate and fill in the cavities.

While the foregoing advantages of the present invention are manifested in the illustrated embodiments of the invention, a variety of changes can be made to the configuration, design and construction of the invention to achieve those advantages. Hence, reference herein to specific details of the structure and function of the present invention is by way of example only and not by way of limitation.

What is claimed is:

1. A method of micro-fabricating high frequency electromagnetic wave source components, comprising:

providing a substrate;

providing a UV-curable photoresist;

using said UV-curable photoresist and photolithography to define at least one from the group consisting of: an output cavity, a waveguide and an alignment feature, on said substrate, wherein using a UV-curable photoresist and photolithography to define at least one of an output cavity, a waveguide or an alignment feature comprises:

coating said substrate with a UV-curable photoresist;

heating said UV-curable photoresist coated substrate at a predetermined temperature and for a predetermined heating duration to drive off solvent in said UV-curable photoresist to obtain a solid UV-curable photoresist layer having a predetermined thickness;

masking said UV-curable photoresist coated substrate with a mask defining said at least one of an output cavity, a waveguide or an alignment feature;

exposing said masked UV-curable photoresist coated substrate to UV light comprising a predetermined intensity for a predetermined exposure time to obtain cured and uncured photoresist;

removing said uncured photoresist leaving said at least one of an output cavity, a waveguide or an alignment feature having substantially vertical sidewalls; and plating said at least one of an output cavity, a waveguide or an alignment feature; and using said UV-curable photoresist and photolithography to define at least one from the group consisting of: a coupling slot, a waveguide iris and a pumpout feature, on said substrate.

2. The method of micro-fabricating high frequency electromagnetic wave source components according to claim 1, wherein said UV-curable photoresist comprises epoxy-based photoresist.

3. The method of micro-fabricating high frequency electromagnetic wave source components according to claim 1, wherein said photolithography comprises using at least one of a binary or digital mask.

4. The method of micro-fabricating high frequency electromagnetic wave source components according to claim 1, wherein said photolithography comprises using a gray scale mask.

5. The method of micro-fabricating high frequency electromagnetic wave source components according to claim 1, wherein said high frequency electromagnetic wave source components include multiple layers and three-dimensional features.

6. The method of micro-fabricating high frequency electromagnetic wave source components according to claim 1, wherein said substrate comprises metal.

7. The method of micro-fabricating high frequency electromagnetic wave source components according to claim 1, wherein said substrate comprises copper.

8. The method of micro-fabricating high frequency electromagnetic wave source components according to claim 1, wherein said substrate comprises a semiconductor.

9. The method of micro-fabricating high frequency electromagnetic wave source components according to claim 1, wherein said substrate comprises silicon.

10. The method of micro-fabricating high frequency electromagnetic wave source components according to claim 1, wherein said substrate comprises an insulator.

11. The method of micro-fabricating high frequency electromagnetic wave source components according to claim 10, wherein said insulator further comprises a layer of electrically conductive material.

12. The method of micro-fabricating high frequency electromagnetic wave source componets according to claim 1, further comprising separating said substrate from said high frequency electromagnetic wave source components.

13. A method of micro-fabricating a high frequency electromagnetic wave source magnetic circuit comprising:

providing a plurality of polepieces;

providing a copper circuit block having predefined water-cooling passages and configured to accept the plurality of polepieces;

brazing said plurality of polepieces to said copper circuit block to obtain a vacuum tight assembly having said plurality of polepieces extending from a surface of said copper circuit block;

flowing a UV-curable photoresist around said plurality of polepieces extending from said surface of said copper circuit block; and photolithographically forming at least one high frequency electromagnetic wave source component using said UV-curable photoresist.

14. The method according to claim 13, wherein providing a plurality of polepieces comprises providing a plurality of polepieces cut from an iron block leaving a web for supporting said plurality of polepieces with uniform spacing and perpendicularity.

15. The method according to claim 13, wherein providing a plurality of polepieces comprises providing a plurality of polepieces micromachined from an iron block leaving a web for supporting said plurality of polepieces with uniform spacing and perpendicularity.

16. The method according to claim 13, wherein providing a plurality of polepieces comprises providing a plurality of polepieces etched from an iron block leaving a web for supporting said plurality of polepieces with uniform spacing and perpendicularity.

17. The method according to claim 13, wherein flowing a UV-curable photoresist comprises flowing epoxy-based photoresist.

18. The method according to claim 13, wherein photolithographically forming at least one high frequency electromagnetic source component comprises using at least one binary or digital mask.

19. The method according to claim 13, wherein photolithographically forming at least one high frequency electromagnetic source component comprises using a gray scale mask.

20. The method according to claim 13, wherein said high frequency electromagnetic wave source magnetic circuit includes multiple layers and three-dimensional features.

21. The method according to claim 13, wherein photolithographically forming at least one high frequency electromagnetic wave source component comprises forming at least one of an output cavity, a waveguide, an alignment feature, a waveguide iris and a pumpout feature.

22. The method according to claim 13, wherein photolithographically forming at least one high frequency electromagnetic wave source component comprises forming at least one of a cavity, coupled cavity, cavities or coupled cavities.

23. A method of micro-fabricating a high frequency electromagnetic wave source magnetic circuit, comprising:

providing a copper substrate assembly;

providing a plurality of polepieces;

brazing said plurality of polepieces to said copper substrate assembly;

flowing a layer of UV-curable photoresist on said copper substrate assembly and in between said plurality of polepieces; and photolithographically forming at least one of an output cavity and a waveguide using said UV-curable photoresist.

24. The method according to claim 23, wherein photolithographically forming at least one of an output cavity and a waveguide using the UV-curable photoresist comprises:

masking said layer of UV-curable photoresist to define said output cavities and said waveguide features;

exposing said masked layer of UV-curable photoresist with UV light to obtain exposed UV-curable photoresist;

removing unexposed UV-curable photoresist leaving said exposed UV-curable photoresist; and depositing a conductive layer to form said output cavities and said waveguide features.

25. The method according to claim 24, wherein said conductive layer comprises copper.

26. The method according to claim 24, wherein masking said layer of UV-curable photoresist comprises using at least one of a binary mask, a digital mask or a gray scale mask.

27. The method according to claim 24, wherein said at least one of an output cavity and a waveguide comprises a multiple layer, three-dimensional structure.

28. The method according to claim 23, wherein providing a plurality of polepieces comprises machining a plurality of uniformly spaced, perpendicular polepieces from an iron block leaving a web at a base to maintain proper orientation of said plurality of polepieces.

29. The method according to claim 28, further comprising:
machining away said web from said plurality of polepieces; and
machining pockets in said conductive layer to accept and align magnets.

30. The method according to claim 23, wherein said UV-curable photoresist comprises epoxy-based photoresist.

31. A method of micro-fabricating a high frequency electromagnetic wave source magnetic circuit, comprising:
providing a copper substrate assembly;
flowing a layer of UV-curable photoresist on said copper substrate assembly;
photolithographically forming output cavities, waveguide features and polepiece slot features using said UV-curable photoresist; and
photolithographically forming a plurality of polepieces in said polepiece slot features.

32. The method according to claim 31, wherein photolithographically forming said output cavities, said waveguide features and said polepiece slot features using said UV-curable photoresist comprises:
masking said layer of UV-curable photoresist to define said output cavities, said waveguide features and said polepiece slot features;
exposing said masked layer of UV-curable photoresist with UV light to obtain exposed UV-curable photoresist;
removing unexposed UV-curable photoresist leaving said exposed UV-curable photoresist; and
depositing a conductive layer on said exposed UV-curable photoresist to form said output cavities and said waveguide features.

33. The method according to claim 32, wherein said conductive layer comprises copper.

34. The method according to claim 32, further comprises using at least one of a binary mask, a digital mask or a gray scale mask.

35. The method according to claim 31, wherein photolithographically forming a plurality of polepieces in said polepiece slot features comprises:
uncovering exposed UV-curable photoresist;
masking said output cavities and said waveguide features;
etching polepiece slots in said polepiece slot features; and
depositing a ferromagnetic material in said polepiece slots.

36. The method according to claim 35, wherein said ferromagnetic material comprises one of iron, iron alloy, Supermalloy or alloys or compounds containing iron or Supermalloy.

37. The method according to claim 31, wherein said UV-curable photoresist comprises epoxy-based photoresist.

38. The method according to claim 31, wherein said high frequency electromagnetic wave source magnetic circuit comprises multiple layers and three-dimensional features.

39. A method of micro-fabricating high frequency electromagnetic wave source components, comprising:
providing a substrate;
providing a UV-curable photoresist;
using said UV-curable photoresist and photolithography to define at least one from the group consisting of: an output cavity, a waveguide and an alignment feature, on said substrate; and
using said UV-curable photoresist and photolithography to define at least one from the group consisting of: a coupling slot, a waveguide iris and a pumpout feature, on said substrate, wherein using a UV-curable photoresist and photolithography to define at least one of a coupling slot, a waveguide iris or a pumpout feature comprises:
coating said substrate with a UV-curable photoresist;
heating said UV-curable photoresist coated substrate at a predetermined temperature and for a predetermined heating duration to drive off solvent in said UV-curable photoresist to obtain a solid UV-curable photoresist layer having a predetermined thickness;
masking said UV-curable photoresist coated substrate with a mask defining said at least one of a coupling slot, a waveguide iris or a pumpout feature;
exposing said masked UV-curable photoresist coated substrate to UV light comprising a predetermined intensity for a predetermined exposure time to obtain cured and uncured photoresist;
removing said uncured photoresist leaving said at least one of a coupling slot, a waveguide iris or a pumpout feature having substantially vertical sidewalls; and
plating said at least one of a coupling slot, a waveguide iris or a pumpout feature.

40. The method of micro-fabricating high frequency electromagnetic wave source components according to claim 39, wherein said UV-curable photoresist comprises epoxy-based photoresist.

41. The method of micro-fabricating high frequency electromagnetic wave source components according to claim 39, wherein said photolithography comprises using at least one of a binary or digital mask.

42. The method of micro-fabricating high frequency electromagnetic wave source components according to claim 39, wherein said photolithography comprises using a gray scale mask.

43. The method of micro-fabricating high frequency electromagnetic wave source components according to claim 39, wherein said high frequency electromagnetic wave source components include multiple layers and three-dimensional features.

44. The method of micro-fabricating high frequency electromagnetic wave source components according to claim 39, wherein said substrate comprises metal.

45. The method of micro-fabricating high frequency electromagnetic wave source components according to claim 39, wherein said substrate comprises copper.

46. The method of micro-fabricating high frequency electromagnetic wave source components according to claim 39, wherein said substrate comprises a semiconductor.

47. The method of micro-fabricating high frequency electromagnetic wave source components according to claim 39, wherein said substrate comprises silicon.

48. The method of micro-fabricating high frequency electromagnetic wave source components according to claim 39, wherein said substrate comprises an insulator.

49. The method of micro-fabricating high frequency electromagnetic wave source components according to claim 48, wherein said insulator further comprises a layer of electrically conductive material.

50. The method of micro-fabricating high frequency electromagnetic wave source components according to claim 39, further comprising separating said substrate from said high frequency electromagnetic wave source components.

* * * * *